(12) United States Patent
Wang et al.

(10) Patent No.: US 11,444,137 B2
(45) Date of Patent: Sep. 13, 2022

(54) DISPLAY PANEL WITH SIMPLIFIED STRUCTURE AND DISPLAY DEVICE COMPRISING THE SAME

(71) Applicants: Beijing BOE Optoelectronics Technology Co., Ltd., Beijing (CN); BOE TECHNOLOGY GROUP CO., LTD., Beijing (CN)

(72) Inventors: Jiaxing Wang, Beijing (CN); Hongliang Yuan, Beijing (CN); Xiaojuan Wu, Beijing (CN); Qi Zheng, Beijing (CN); Yao Bi, Beijing (CN); Zhiqiang Zhao, Beijing (CN); Xuan Zhong, Beijing (CN); Zhangxiang Cheng, Beijing (CN); Donghua Zhang, Beijing (CN)

(73) Assignees: Beijing BOE Optoelectronics Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 272 days.

(21) Appl. No.: 16/824,841

(22) Filed: Mar. 20, 2020

(65) Prior Publication Data
US 2021/0083021 A1 Mar. 18, 2021

(30) Foreign Application Priority Data
Sep. 12, 2019 (CN) .......................... 201910862298.X

(51) Int. Cl.
*H01L 27/32* (2006.01)
*H01L 51/50* (2006.01)
(Continued)

(52) U.S. Cl.
CPC .......... *H01L 27/3244* (2013.01); *G09F 9/302* (2013.01); *G09G 3/2085* (2013.01);
(Continued)

(58) Field of Classification Search
CPC ....... G09F 9/302; G09F 9/335; G09G 3/2085; G09G 2300/0426; H01L 27/3244;
(Continued)

(56) References Cited

U.S. PATENT DOCUMENTS 6,850,212 B1  2/2005 Aitken et al.
10,475,401 B1 * 11/2019 Hayes .................. G02B 26/005
(Continued)

FOREIGN PATENT DOCUMENTS

CN  1251677 A  4/2000
CN  1500228 A  5/2004
(Continued)

OTHER PUBLICATIONS

"First Office Action and English language translation", CN Application No. 201910862298.X, dated Aug. 30, 2021, 14 pp.

*Primary Examiner* — Tracie Y Green
(74) *Attorney, Agent, or Firm* — Myers Bigel, P.A.

(57) ABSTRACT

A display panel and a display device including the display panel are provided. The display panel includes a first substrate and a second substrate opposite to each other. The first substrate includes a first base, and the second substrate
(Continued)

includes a second base. The first substrate further includes a plurality of first electrodes in an array on the first base, and the second substrate further includes a plurality of second electrodes in an array on the second base. An orthographic projection of each second electrode on the first base at least partially overlaps orthographic projections of n first electrodes on the first base, n is an integer greater than 1.

14 Claims, 9 Drawing Sheets

(51) Int. Cl.
    H01L 51/52      (2006.01)
    H01L 51/56      (2006.01)
    G09F 9/302      (2006.01)
    G09G 3/20       (2006.01)
    G09F 9/33       (2006.01)
    G02F 1/1343     (2006.01)

(52) U.S. Cl.
    CPC ...... *H01L 51/5012* (2013.01); *H01L 51/5203* (2013.01); *H01L 51/56* (2013.01); *G02F 1/134309* (2013.01); *G09F 9/335* (2021.05); *G09G 2300/0426* (2013.01)

(58) Field of Classification Search
    CPC . H01L 51/5012; H01L 51/5203; H01L 51/56; H01L 27/3288; G02F 1/134309; G02F 1/1333
    See application file for complete search history.

(56) References Cited

U.S. PATENT DOCUMENTS

| 2002/0180670 | A1* | 12/2002 | Kim ............... H01L 27/3288 345/76 |
| 2003/0193298 | A1* | 10/2003 | Okada ............... G09G 3/3216 315/169.3 |
| 2004/0108819 | A1 | 6/2004 | Arai et al. |
| 2005/0280612 | A1 | 12/2005 | Yamamoto et al. |
| 2010/0214520 | A1 | 8/2010 | Miyaki et al. |
| 2017/0255287 | A1* | 9/2017 | Huang ............... G06F 3/0445 |
| 2018/0232075 | A1* | 8/2018 | Yang ............... G06F 3/0443 |
| 2018/0284926 | A1* | 10/2018 | Kim ............... G06F 3/0446 |
| 2018/0373387 | A1* | 12/2018 | Tsai ............... G06F 3/04166 |
| 2020/0159050 | A1* | 5/2020 | Chung ............... G09G 3/36 |

FOREIGN PATENT DOCUMENTS

| CN | 103155202 A | 6/2013 | |
| CN | 106647063 A | 5/2017 | |
| JP | 2006010742 A | 1/2006 | |
| TW | 200304632 A | 10/2003 | |
| WO | 2012050586 A1 | 4/2012 | |
| WO | WO-2018157634 A1 * | 9/2018 | ........... G02F 1/1343 |

* cited by examiner

DISPLAY PANEL WITH SIMPLIFIED STRUCTURE AND DISPLAY DEVICE COMPRISING THE SAME

RELATED APPLICATION

The present application claims the benefit of Chinese Patent Application No. 201910862298.X, filed on Sep. 12, 2019, the entire disclosure of which is incorporated herein by reference.

TECHNICAL FIELD

The present disclosure relates to the field of display technologies, especially to a display panel, a method for manufacturing the same, and a display device.

BACKGROUND

Display panels of large-sized billboards or signage arranged at airports, railways, bus stops and other places often have pixels of large size up to the millimeter level, which usually employ conventional LED (Light Emitting Diode) displays or TFT-LCD (Thin Film Transistor Liquid Crystal Display) display technology. However, LED displays tend to have great power consumption, and TFT-LCDs involve high manufacturing cost and complicated process.

SUMMARY

Embodiments of the disclosure provide a display panel comprising a first substrate and a second substrate opposite to each other. The first substrate comprises a first base, the second substrate comprises a second base, the first substrate further comprises a plurality of first electrodes in an array on the first base, and the second substrate further comprises a plurality of second electrodes in an array on the second base. An orthographic projection of each second electrode of the plurality of second electrodes on the first base at least partially overlaps orthographic projections of n first electrodes of the plurality of first electrodes on the first base, n is an integer greater than 1.

In some embodiments, the first substrate further comprises a plurality of first leads outside a region of the plurality of first electrodes, the plurality of first leads are configured to transmit a first driving signal to the plurality of first electrodes. The second substrate further comprises a plurality of second leads outside a region of the plurality of second electrodes, the plurality of second leads are configured to transmit a second driving signal to the plurality of second electrodes.

In some embodiments, at least two first electrodes in each column of first electrodes among the plurality of first electrodes are electrically connected to a same first lead to receive a same first driving signal.

In some embodiments, h first leads among the plurality of first leads are configured to transmit the first driving signal to a column of first electrodes among the plurality of first electrodes. Consecutive k columns of first electrodes adjacent to the column of first electrodes are electrically connected to the h first leads, respectively, h and k are both integers greater than or equal to 1.

In some embodiments, h first leads among the plurality of first leads are configured to transmit the first driving signal to a column of first electrodes among the plurality of first electrodes, the h first leads are electrically connected to first h first electrodes in the column of first electrodes, respectively, and the h first electrodes are closer to the h first leads than remaining first electrodes in the column of first electrodes. An i-th first electrode among the h first electrodes is electrically connected to a $(2h-(i-1))$-th first electrode and a $(2h+i)$-th first electrode in the column of first electrodes, h is an integer greater than or equal to 1, and i is an integer greater than or equal to 1 and less than or equal to h.

In some embodiments, two first electrodes adjacent to each other and electrically connected to each other in the column of first electrodes among the plurality of first electrodes form an integral electrode block.

In some embodiments, the plurality of first leads comprises m sets of first leads, each set of first leads are electrically connected to two adjacent columns of first electrodes among the plurality of first electrodes, respectively. Orthographic projections of any column of second electrodes among the plurality of second electrodes on the first base cover orthographic projections of two adjacent columns of first electrodes not electrically connected to a same set of first leads on the first base, and m is an integer greater than 1.

In some embodiments, the n first electrodes are electrically connected to different first leads among the plurality of first leads, respectively.

In some embodiments, the display panel further comprises a liquid crystal layer between the first substrate and the second substrate.

In some embodiments, the display panel further comprises an organic electroluminescent layer, the organic electroluminescent layer is located between the plurality of first electrodes and the plurality of second electrodes.

In some embodiments, the orthographic projection of each second electrode of the plurality of second electrodes on the first base covers the orthographic projections of the n first electrodes on the first base.

Another embodiment of the disclosure provides a display device comprising the display panel according to any one of the foregoing embodiments. The first substrate further comprises a plurality of first leads outside a region of the plurality of first electrodes, the plurality of first leads are configured to transmit a first driving signal to the plurality of first electrodes, and the second substrate further comprises a plurality of second leads outside a region of the plurality of second electrodes, the plurality of second leads are configured to transmit a second driving signal to the plurality of second electrodes.

In some embodiments, at least two first electrodes in each column of first electrodes among the plurality of first electrodes are electrically connected to a same first lead to receive a same first driving signal.

In some embodiments, h first leads among the plurality of first leads are configured to transmit the first driving signal to a column of first electrodes among the plurality of first electrodes, wherein consecutive k columns of first electrodes adjacent to the column of first electrodes are electrically connected to the h first leads, respectively, h and k are both integers greater than or equal to 1.

In some embodiments, h first leads among the plurality of first leads are configured to transmit the first driving signal to a column of first electrodes among the plurality of first electrodes, the h first leads are electrically connected to first h first electrodes in the column of first electrodes, respectively, and the h first electrodes are closer to the h first leads than remaining first electrodes in the column of first electrodes. An i-th first electrode among the h first electrodes is electrically connected to a $(2h-(i-1))$-th first electrode and a $(2h+i)$-th first electrode in the column of first electrodes, h is an integer greater than or equal to 1, and i is an integer greater than or equal to 1 and less than or equal to h.

In some embodiments, the plurality of first leads comprises m sets of first leads, each set of first leads are electrically connected to two adjacent columns of first electrodes among the plurality of first electrodes, respectively, orthographic projections of any column of second electrodes among the plurality of second electrodes on the first base cover orthographic projections of two adjacent columns of first electrodes not electrically connected to a same set of first leads on the first base, and m is an integer greater than 1.

In some embodiments, the display panel further comprises a liquid crystal layer between the first substrate and the second substrate.

In some embodiments, the display panel further comprises an organic electroluminescent layer, the organic electroluminescent layer is located between the plurality of first electrodes and the plurality of second electrodes.

Yet another embodiment of the disclosure provides a method for manufacturing a display panel, comprising: preparing a first substrate, the first substrate comprising a first base and a plurality of first electrodes in an array on the first base; and preparing a second substrate, the second substrate comprising a second base and a plurality of second electrodes in an array on the second base. An orthographic projection of each second electrode of the plurality of second electrodes on the first base at least partially overlaps orthographic projections of n first electrodes of the plurality of first electrodes on the first base, n is an integer greater than 1.

In some embodiments, the preparing the first substrate comprises fabricating a plurality of first leads on the first base, the plurality of first leads are configured to transmit a first driving signal to the plurality of first electrodes, at least two first electrodes in each column of first electrodes among the plurality of first electrodes are electrically connected to a same first lead to receive a same first driving signal.

The features and advantages disclosed by embodiments herein will be further explained in the following description, and will partially become apparent from the description, or be understood by implementing embodiments of the present disclosure.

BRIEF DESCRIPTION OF THE DRAWINGS

The drawings are provided for illustrating the technical solutions of the present disclosure, and constitute a part of the specification, which are used to explain the technical solutions of the present disclosure together with embodiments herein. The drawings do not constitute a limitation on the protection scope of the present application. The shapes and sizes of the components in the drawings are not drawn to scale, the purpose of which is only to illustrate the present disclosure.

DETAILED DESCRIPTION OF EMBODIMENTS

Figure 1:
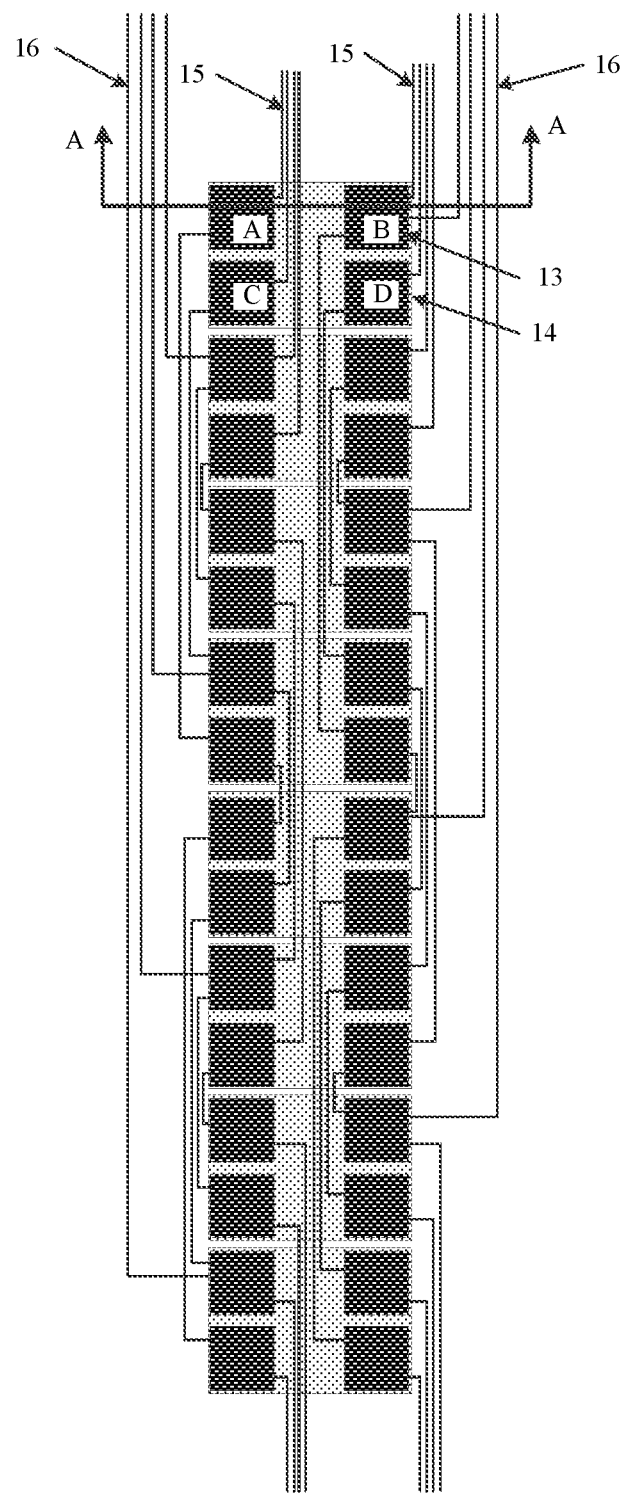
FIG. 1 is a partial top view of a display panel according to an embodiment of the present disclosure.

The present disclosure describes various embodiments, but the description is exemplary rather than restrictive, and it will be apparent to a person of ordinary skill in the art that there may be more embodiments and implementations within the scope revealed by the embodiments described in the present disclosure. Although many possible combinations of features are shown in the drawings and discussed in the embodiments, many other combinations of the disclosed features are also possible. Except where specifically limited, any feature or element of an embodiment may be combined with or may replace any other feature or element of any other embodiment.

The present disclosure includes and conceives combinations of features and elements known to a person of ordinary skill in the art. The embodiments, features and elements that have been disclosed herein may also be combined with any conventional features or elements to form unique inventive solutions defined by the claims. Any feature or element of an embodiment may also be combined with features or elements from other inventive solutions to form other unique inventive solutions defined by the claims. Therefore, it should be understood that, any feature shown and/or discussed in the present disclosure may be implemented individually or in any suitable combination. Accordingly, the embodiments are not limited except by the limitations of the appended claims and their equivalents. In addition, various modifications and changes may be made within the scope of the appended claims.

A display panel provided by an embodiment of the present disclosure comprises a first substrate and a second substrate opposite to each other. The first substrate comprises a first base, the second substrate comprises a second base. The first substrate further comprises a plurality of first electrodes arranged in an array on the first base, and the second substrate further comprises a plurality of second electrodes arranged in an array on the second base. An orthographic projection of each second electrode on the first base at least partially overlaps orthographic projections of n first electrodes on the first base, where n is an integer greater than 1.

The feature "an orthographic projection of each second electrode on the first base at least partially overlaps orthographic projections of n first electrodes on the first base" mentioned herein includes the case where the orthographic projection of the second electrode on the first base partially overlaps the orthographic projections of n first electrodes on the first base, and may also includes the case where the orthographic projection of the second electrode on the first base covers the orthographic projections of n first electrodes on the first base. In some embodiments, the orthographic projection of the second electrode on the first base covers the orthographic projections of the n first electrodes on the first base. Considering the actual manufacturing process, the second electrode may not be accurately aligned with the n electrodes, and the orthographic projection of the second electrode on the first base may only partially overlap the orthographic projections of the n first electrodes on the first base.

The first electrode on the first base may receive a first driving signal from an external signal source (e.g., a driving chip), and the second electrode on the second base may receive a second driving signal from an external signal source, so that a voltage difference is generated between the first electrode and the second electrode. According to some embodiments of the disclosure, the display panel comprises a liquid crystal layer between the first substrate and the second substrate. Liquid crystal molecules in the liquid crystal layer may be deflected under the effect of an electric field generated by the voltage difference between the first electrode and the second electrode, so that the light transmittance of the liquid crystal layer is adjusted to control the brightness and darkness of pixels of the display panel. In this case, the first driving signal and the second driving signal may be image signals, and an electric field formed by a single first electrode and a corresponding second electrode may be regarded as being configured to drive liquid crystal molecules in a single pixel unit, that is, a single first electrode may be understood as being corresponding to one pixel unit. Therefore, for the liquid crystal display panel of this embodiment, gate lines and a gate driving circuit in a conventional liquid crystal display panel are not necessary, so that the structure of the display panel is significantly simplified and the manufacturing cost is reduced. In another embodiment, the display panel comprises an organic electroluminescent layer between the plurality of first electrodes in an array and the plurality of second electrodes in an array. Similarly, a single first electrode may correspond to a pixel unit, and the organic electroluminescent layer can emit light under the effect of the voltage difference between the first electrode and the second electrode. Thus, a passive matrix organic electroluminescent display panel is actually formed, for example, a passive matrix OLED display panel. Of course, in addition to the first electrode, the second electrode, and the organic electroluminescent layer, the pixel unit of the OLED display panel further comprises other structures for promoting the organic electroluminescent layer to emit light under the effect of an external voltage difference, which are familiar to those skilled in the art and will not be described in detail here.

According to some embodiments of the disclosure, the first substrate further comprises a plurality of first leads outside a region of the array of the plurality of first electrodes, and the plurality of first leads are configured to transmit a first driving signal to the plurality of first electrodes. The second substrate further comprises a plurality of second leads outside a region of the array of the plurality of second electrodes, and the plurality of second leads are configured to transmit a second driving signal to the plurality of second electrodes. FIG. 1 schematically shows a first lead 15 and a second lead 16. The first lead may be electrically connected to a first driving circuit (not shown in the figure), and the second lead may be electrically connected to a second driving circuit (not shown in the figure). The first driving circuit and the second driving circuit may be in the same chip, and the example of FIG. 1 will be further described below.

For the display panel provided by the embodiment of the present disclosure, as described above, a single first electrode may correspond to a pixel unit, and each second electrode corresponds to n first electrodes, thus one single second electrode may correspond to n pixel units. The plurality of first electrodes in an array and the plurality of second electrodes in an array may form driving electrodes for a pixel matrix. The display panel provided by the embodiment of the disclosure is applicable to application scenarios of large-sized display screens, and can simplify the structure of the display panel.

According to an embodiment of the disclosure, at least two first electrodes in each column of first electrodes among the plurality of first electrodes in an array are electrically connected to the same first lead to receive the same first driving signal. The two first electrodes electrically connected to the same first lead may be adjacent to each other. Alternatively, they may be spaced apart by other first electrodes. As a result, the wiring layout for the first electrodes of the first electrode array can be simplified.

The technical solutions of the embodiments of the disclosure will be described in detail below through specific examples. It is to be noted that the specific examples below are described taking the first electrodes and the second electrodes arranged in a column direction as an example. However, the "column" and "column direction" mentioned herein are only explained based on the drawings, and do not indicate an absolute orientation. After the viewing angle is changed or the figures are rotated, the "column" here may become "row". Accordingly, the drawings and examples described here do not limit the protection scope of the present disclosure.

Figure 2:
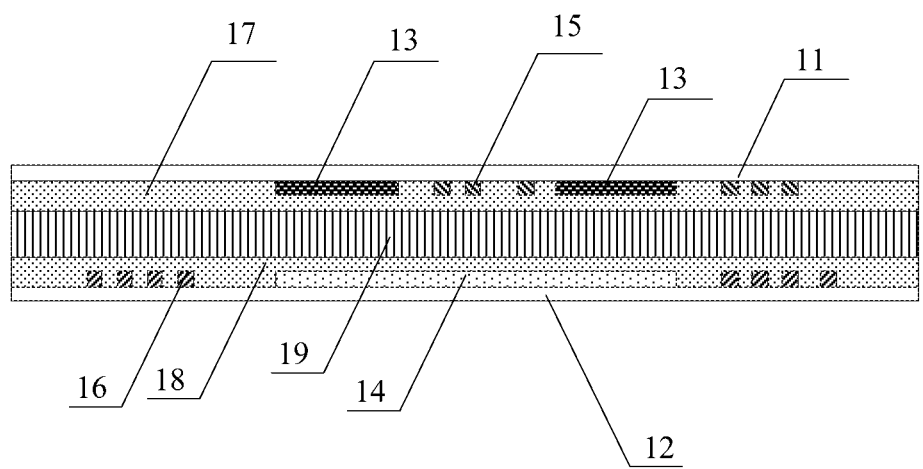
FIG. 2 is a sectional view taken along the line A-A in FIG. 1.

FIG. 1 is a partial top view of a display panel according to an embodiment of the disclosure, and FIG. 2 is a sectional view taken along the line A-A in FIG. 1. As shown in FIGS. 1 and 2, the display panel provided by this embodiment comprises a first substrate and a second substrate opposite to each other, and a liquid crystal layer 19 between the first substrate and the second substrate. The first substrate comprises a first base 11, a plurality of first electrodes 13 in an array on the first base 11, and first leads 15 for electrically connecting each of the first electrodes 13 to a first driving circuit. The second substrate comprises a second base 12, a plurality of second electrodes 14 in an array on the second base 12, and second leads 16 for electrically connecting each of the second electrodes 14 to a second driving circuit. The side of the first base 11 on which the first electrodes 13 are arranged faces the side of the second base 12 on which the second electrodes 14 are arranged.

In this embodiment, a single second electrode 14 corresponds to four second electrodes 13, that is, the orthographic projection of each second electrode 14 on the first base 11 covers the orthographic projections of four first electrodes 13 on the first base. The four first electrodes 13 corresponding to each second electrode 14 are arranged in a 2*2 array, and each second electrode 14 and four first electrodes 13 can form 2*2 pixels. However, the disclosure would not be limited to this. For example, in other embodiments, each second electrode may correspond to 2*1 first electrodes to form 2*1 pixels, or each second electrode may correspond to 3*3 first electrodes to form 3*3 pixels.

As shown in FIG. 2, in this embodiment, the first substrate is an upper substrate, and the second substrate is a lower substrate. However, the present disclosure does not impose any limitation in this regard. In another embodiment, the first substrate may be a lower substrate, and the second substrate may be an upper substrate.

In the embodiment of FIG. 2, in order to clearly illustrate the relationship between the first electrodes and the second electrodes and the layout of the first leads and the second leads, only eight sets of electrodes are shown as an example for description. Each set of electrodes includes a second electrode and 2*2 first electrodes whose orthographic projections on the first base overlap the orthographic projection of the second electrode on the first base. Therefore, one column of second electrodes may correspond to two columns of first electrodes.

Figure 3:
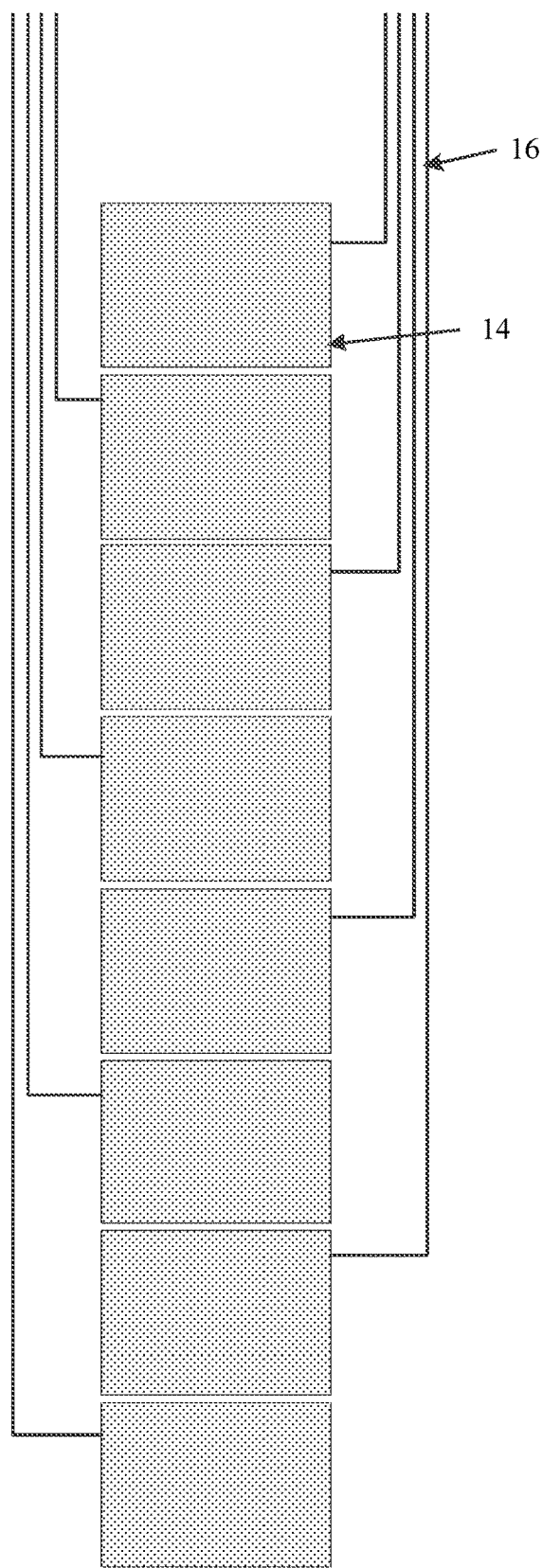
FIG. 3 is an example diagram of second electrodes according to an embodiment of the present disclosure.

FIG. 3 is a schematic view of a second electrode according to an embodiment of the disclosure. As shown in FIGS. 1 and 3, each second electrode 14 is connected to a second lead 16, and each second electrode 14 may be electrically connected to a first driving circuit (not shown) through a second lead 16. The orthographic projection of each second electrode 14 on the first base covers the orthographic projections of four first electrodes 13 on the first base, the second electrode and the four first electrodes correspond to a region of four pixels, therefore, the second driving signal transmitted by each second lead is capable of driving four pixels simultaneously, which simplifies the wiring layout as compared with the related art in which the driving signal transmitted by a single lead only drives one pixel.

Figure 5:
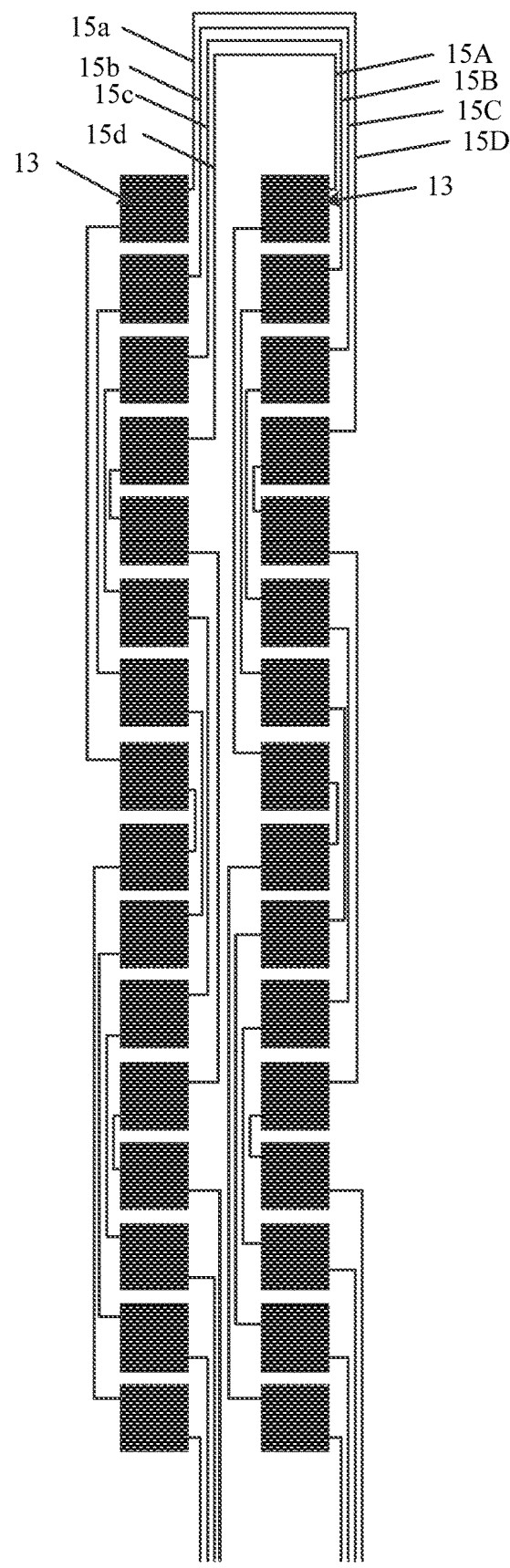
FIG. 5 is an example diagram of first electrodes according to another embodiment of the present disclosure.

According to an embodiment of the disclosure, h first leads among the plurality of first leads are configured to transmit a first driving signal to a column of first electrodes among the plurality of first electrodes in an array, and consecutive k columns of first electrodes adjacent to the column of first electrodes are electrically connected to the h first leads, respectively, where h and k are both integers greater than or equal to 1. For example, as shown in FIG. 5, four first leads are configured to transmit a first driving signal to a first column of first electrodes, and a second column of first electrodes adjacent to the first column of first electrodes are electrically connected to the four first leads, respectively. That is, the four first leads transmit the first driving signal to consecutive two columns of first electrodes. The four first leads can be regarded as a set of first leads. In other embodiments, a set of first leads may be configured to transmit the first driving signal to consecutive multiple columns of first electrodes, thereby simplifying the layout of first leads.

Figure 4:
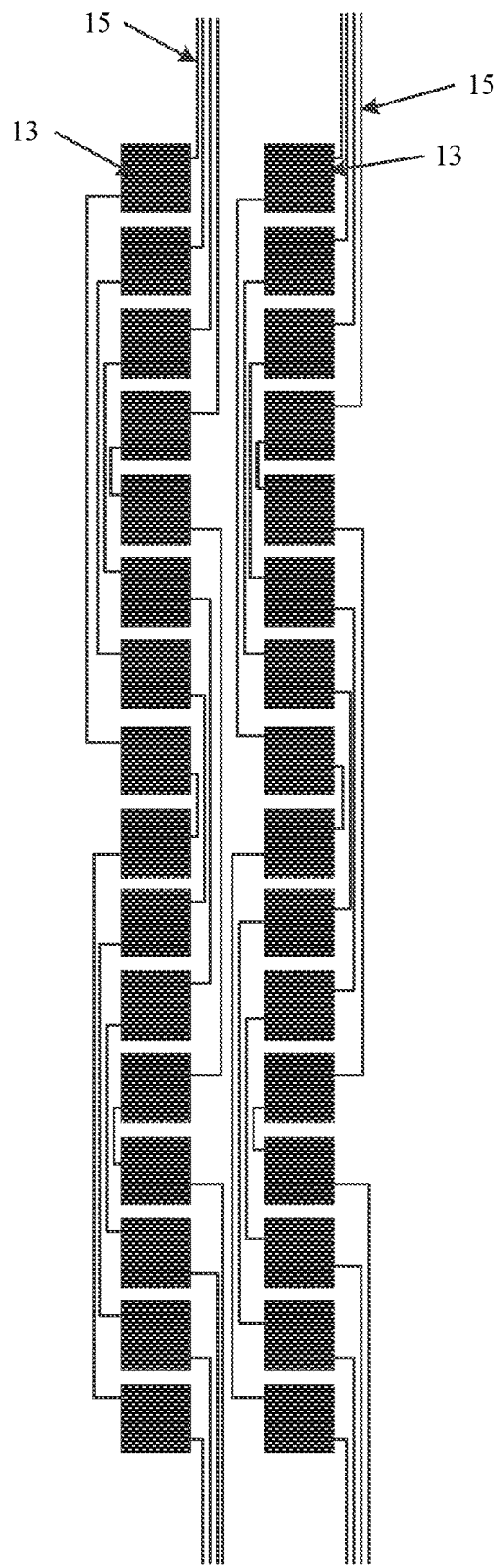
FIG. 4 is an example diagram of first electrodes according to an embodiment of the present disclosure.

According to a further embodiment of the disclosure, h first leads among the plurality of first leads are configured to transmit the first driving signal to a column of first electrodes among the plurality of first electrodes in an array, the h first leads are electrically connected to first h first electrodes in this column of first electrodes, respectively, and the h first electrodes are closer to the h first leads than the remaining first electrodes in this column of first electrodes. The i-th first electrode among the h first electrodes is electrically connected to the (2h−(i−1))-th first electrode and the (2h+i)-th first electrode in this column of first electrodes, where h is an integer greater than or equal to 1, and i is an integer greater than or equal to 1 and less than or equal to h. FIGS. 1 and 4 illustrate such examples, and in these examples, h=4. As shown in FIG. 4, four first leads 15 are parallel to each other and are electrically connected to first four first electrodes in the first column of first electrodes, respectively. In this embodiment, for any column of the first electrodes, the first first electrode is electrically connected to the eighth first electrode, the ninth first electrode and the sixteenth first electrode successively, the second first electrode is electrically connected to the seventh first electrode, the tenth first electrode and the fifteenth first electrode successively, the third first electrode is electrically connected to the sixth first electrode, the eleventh first electrode and the sixteenth first electrode successively, and the fourth first electrode is electrically connected to the fifth first electrode, the twelfth first electrode and the thirteenth first electrode successively. In this way, it is enabled to drive a column of first electrodes with four first leads. In this embodiment, once the first electrode 13 and the second electrode 14 receive an effective driving signal, a pixel comprising the first electrode 13 and the second electrode 14 would emit light. As shown in FIG. 1, in case the first second electrode 14 receives a driving signal from the second driving circuit, the first first electrode 13 in the first column receives a driving signal provided by the first driving circuit, and the second first electrode 13 in the first column and the first and second first electrodes 13 in the second column do not receive a driving signal, a pixel A emits light, and pixels B, C and D do not emit light. In case the first second electrode 14 receives a driving signal provided by the second driving circuit, and the first first electrode 13 in the first column, the second first electrode 13 in the first column, and the first and second first electrodes 13 in the second column receive a driving signal from the first driving circuit, pixels A, B, C and D are all emit light.

In this embodiment, a large-sized second electrode 14 may cooperate with multiple small-sized first electrodes 13 to drive a plurality of pixels. By properly setting the dimensional relationship between the first electrode and the second electrode, and the connection relationship between the multiple first electrodes corresponding to the second electrode, a plurality of pixels involving the first electrodes and the corresponding second electrode can be independently controlled. As shown in FIG. 1, four first electrodes 13 in cooperation with one second electrode 14 are connected to the first driving circuit through different first leads. In this way, in order that four pixels comprising one second electrode 14 and four first electrodes 13 in cooperation with each other emit light, the second electrode 14 needs to receive an effective second driving signal and the corresponding four first electrodes 13 need to receive an effective first driving signal, respectively. At that time, the second electrode 14 and any one of the first electrodes 13 receive an effective driving signal, a pixel comprising the first electrode 13 and the second electrode 14 in cooperation with each other would emit light, which can ensure the display accuracy of the display panel. In another embodiment, for some application scenarios that do not require high display accuracy, at least two of the plurality of pixels comprising the first electrodes and the second electrode in cooperation with each other may share a driving signal. In other words, one or more first electrodes whose orthographic projections on the first base have an overlap with the orthographic projection of the second electrode on the first base may be connected to the first driving circuit through the same first lead. For example, based on the first electrodes and the second electrodes shown in FIG. 1, two adjacent first electrodes in the same column may be connected together in series. At that time, by controlling the driving signals for the first electrode and the second electrode, pixels A and C in FIG. 1 can be controlled to emit light at the same time, and pixels B and D can be controlled to emit light at the same time.

The technical solution of the embodiment will be further described below by taking the manufacturing process of a liquid crystal display panel as an example. The "patterning process" mentioned in this embodiment includes processings such as depositing a film layer, coating a photoresist, exposing a mask, development, etching, and stripping off a photoresist, which is a mature manufacturing process in related technologies. Deposition may be implemented by known processes such as sputtering, evaporation, chemical vapor deposition, etc., coating may involve known coating processes, and etching may employ known methods, which are not specifically limited herein. In the description of this embodiment, it is to be understood that "thin film" refers to a layer of film made of a certain material on a substrate by using deposition or other processes. If manufacturing the "thin film" does not require a patterning process, the "thin film" may also be referred to as a "layer". If the "thin film" has to be subjected to a patterning process during the entire manufacturing process, it is referred to as a "thin film" before the patterning process, and is referred to as a "layer" after the patterning process is accomplished. The "layer" obtained from the patterning process includes at least one "pattern". The manufacturing process of a liquid crystal display panel may comprise the following steps.

(1) Preparing a first substrate and a second substrate, the first substrate comprising a first base, a plurality of first electrodes in an array on the first base, and first leads for electrically connecting each of the first electrodes to a first driving circuit; the second substrate comprising a second base, a plurality of second electrodes in an array on the second base, and second leads for electrically connecting each of the second electrodes to a second driving circuit.

Forming the first electrodes and the first leads on the first base may comprise: depositing a first conductive thin film on a first base 11, patterning the first conductive thin film through a patterning process, forming patterns of the first electrodes 13 and the first leads 15, as shown in FIG. 2.

Forming the second electrodes and the second leads on the second base may comprise: depositing a second conductive thin film on a second base 12, patterning the second conductive thin film through a patterning process, forming patterns of the second electrodes 14 and the second leads 16, as shown in FIG. 2.

The first base 11 and the second base 12 may be transparent glass substrates or transparent PET film substrates. The first conductive thin film and the second conductive thin film may be made of a transparent conductive material, such as indium tin oxide (ITO).

(2) Forming a first alignment layer on the first substrate, and forming a second alignment layer on the second substrate.

Forming a first alignment layer on the first substrate may comprise: coating a transparent first alignment film on the first substrate, curing the first alignment film, and processing the cured first alignment film with an alignment technology to obtain a transparent first alignment layer 17. The alignment technology may include a rubbing alignment technology and an ultraviolet light alignment technology. The alignment technology may form a groove on the surface of the first alignment layer 17 for aligning liquid crystal molecules so that the liquid crystal molecules are arranged along a certain direction. The material of the first alignment film may comprise but not limited to polyimide, polyamide, polyethylene, polystyrene, or polyvinyl alcohol. Similarly, a second alignment layer 18 may be formed on the second substrate.

(3) Arranging a liquid crystal layer between the first alignment layer and the second alignment layer, the first electrode 13 on the first base 11 facing the second electrode 14 on the second base 12.

A sealant may be pressed between the first alignment layer 17 and the second alignment layer 18, and a liquid crystal cavity is formed by the sealant and the two alignment layers. A liquid crystal layer 19 is formed by filling the liquid crystal cavity with a liquid crystal material, as shown in FIG. 2. In this way, the liquid crystal material can be confined in the liquid crystal cavity, and no leakage phenomenon will occur.

Once the first driving circuit and the second driving circuit transmit driving signals to the first electrodes 13 and the second electrode 14, respectively, an electric field can be formed between the second electrode 14 and the corresponding first electrodes, which drives the liquid crystal molecules to deflect, thereby achieving image display.

In some embodiments, the liquid crystal cavity may be filled with polymer dispersed liquid crystal (PDLC). In this case, there is no need to dispose a polarizer on outer sides of the first substrate and the second substrate. In an alternative embodiment, the liquid crystal cavity may be filled with an ordinary liquid crystal material, and after step (3), the manufacturing process may further comprise: disposing a first polarizer on an outer side (i.e., a side facing away the liquid crystal layer) of the first substrate, and disposing a second polarizer on an outer side (i.e., a side facing away the liquid crystal layer) of the second substrate.

It can be seen from the manufacturing process of a liquid crystal display panel according to this embodiment that, this embodiment can provide a passive display panel, which can reduce the driving signal channels by properly designing the layout of leads for transmitting driving signals, and is applicable to application scenarios of large-sized pixels, achieving power consumption reduction, simple process, and low cost.

Figure 6:
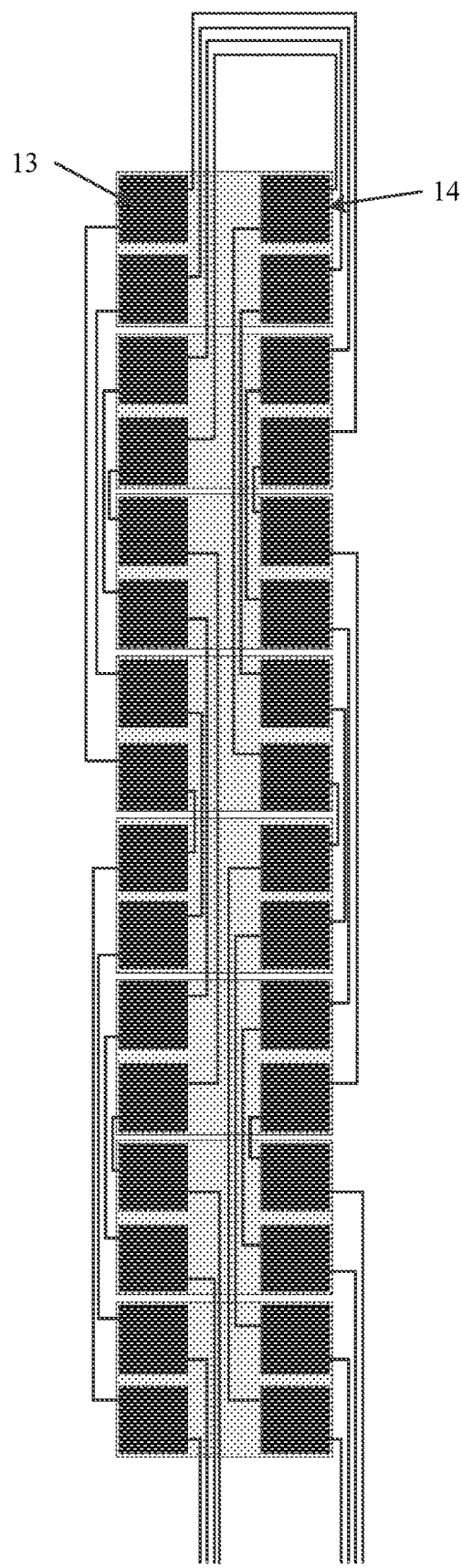
FIG. 6 is an example diagram of a positional relationship between first electrodes and second electrodes according to another embodiment of the present disclosure.

FIG. 5 is an example diagram of a connection relationship between first electrodes according to an embodiment of the disclosure. FIG. 6 shows a positional relationship between first electrodes and second electrodes corresponding to the example of FIG. 5. In the example of FIG. 5 or FIG. 6, every 4 first leads are configured to transmit a first driving signal to a column of first electrodes among the plurality of first electrodes in an array, and consecutive k columns of first electrodes adjacent to this column of first electrodes are electrically connected to the four first leads, respectively. In this example, k is 1, and the connection relationships between the first electrodes in each column of the first electrodes are the same.

As shown in FIG. 5, a first column of first electrodes 13 are electrically connected to first leads 15a, 15b, 15c, 15d, and a second column of first electrodes 13 are electrically connected to first leads 15A, 15B, 15C, 15D. The first leads 15a, 15b, 15c, 15d are connected to the first leads 15A, 15B, 15C, 15D, respectively. Therefore, the first column of first electrodes and the second column of first electrodes are actually electrically connected to the same set of first leads.

Figure 7:
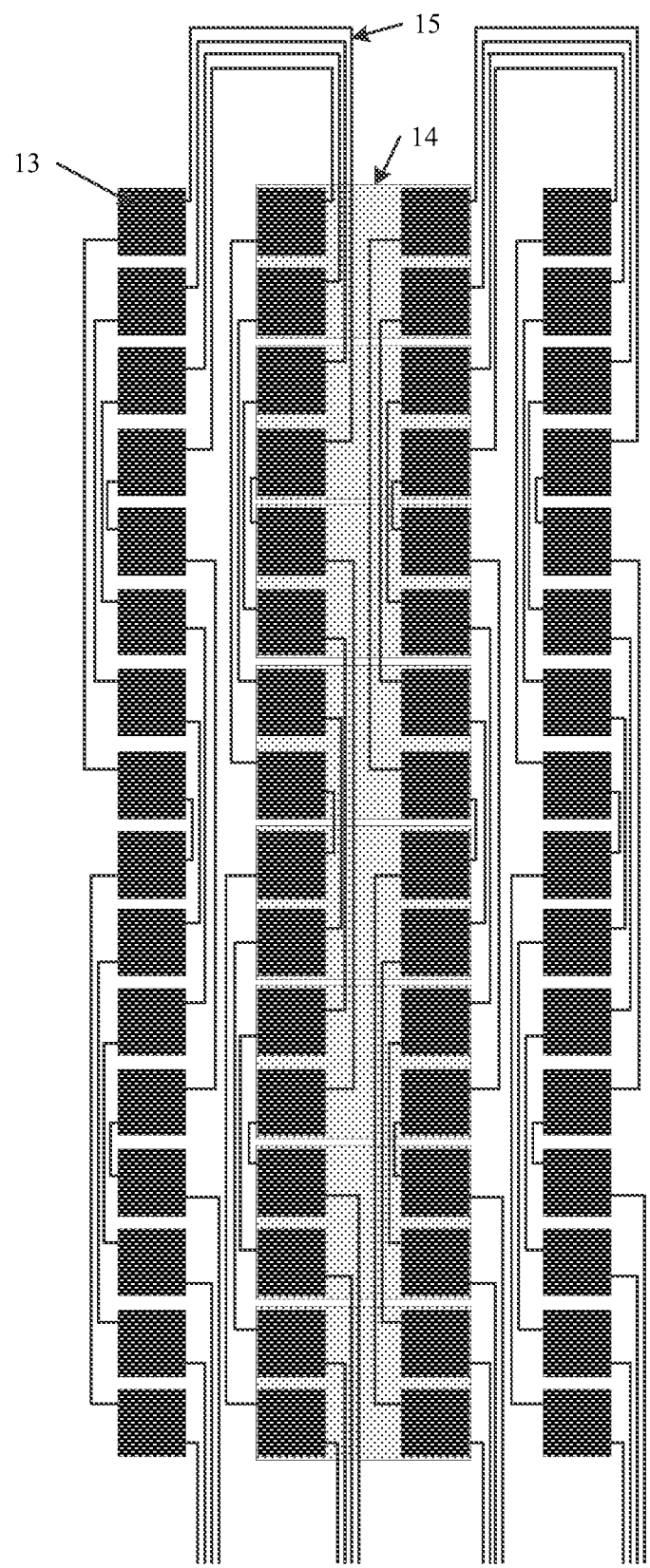
FIG. 7 is an example diagram of a positional relationship between first electrodes and second electrodes according to a further embodiment of the present disclosure.

According to another embodiment of the disclosure, the plurality of first leads on the first substrate include m sets of first leads, and each set of first leads is electrically connected to two adjacent columns of first electrodes among the plurality of first electrodes in an array, respectively. The orthographic projection of any column of second electrodes among the plurality of second electrodes in an array on the first base covers the orthographic projections of two adjacent columns of first electrodes not electrically connected to the same set of first leads on the first base, where m is an integer greater than 1. As shown in FIG. 7, the plurality of first leads on the first substrate are divided into a plurality of sets of first leads, each set of first leads includes four first leads 15, and each set of first leads is electrically connected to two adjacent columns of first electrodes, respectively. The orthographic projections of any column of second electrodes 14 on the first base cover the orthographic projections of two adjacent columns of first electrodes 13 not electrically connected to the same set of first leads on the first base. In this way, for two adjacent columns of first electrodes electrically connected to the same set of first leads, since they correspond to different columns of second electrodes, pixel units to which the two adjacent columns of first electrodes correspond can still be driven independently. For example, as shown in FIG. 7, a column of second electrodes 14 cooperates with two adjacent columns of first electrodes 13 which are not electrically connected to the same set of first leads 15 respectively to form two different columns of pixel units. The two columns of first electrodes 13 can receive different first driving signals, and the second electrodes corresponding to the other columns of first electrodes adjacent to the two columns of first electrodes 13 are independent of that column of second electrodes 14. As a result, each column of pixel units can be driven independently, while simplifying the layout of leads electrically connected to the external driving circuits.

Figure 8:
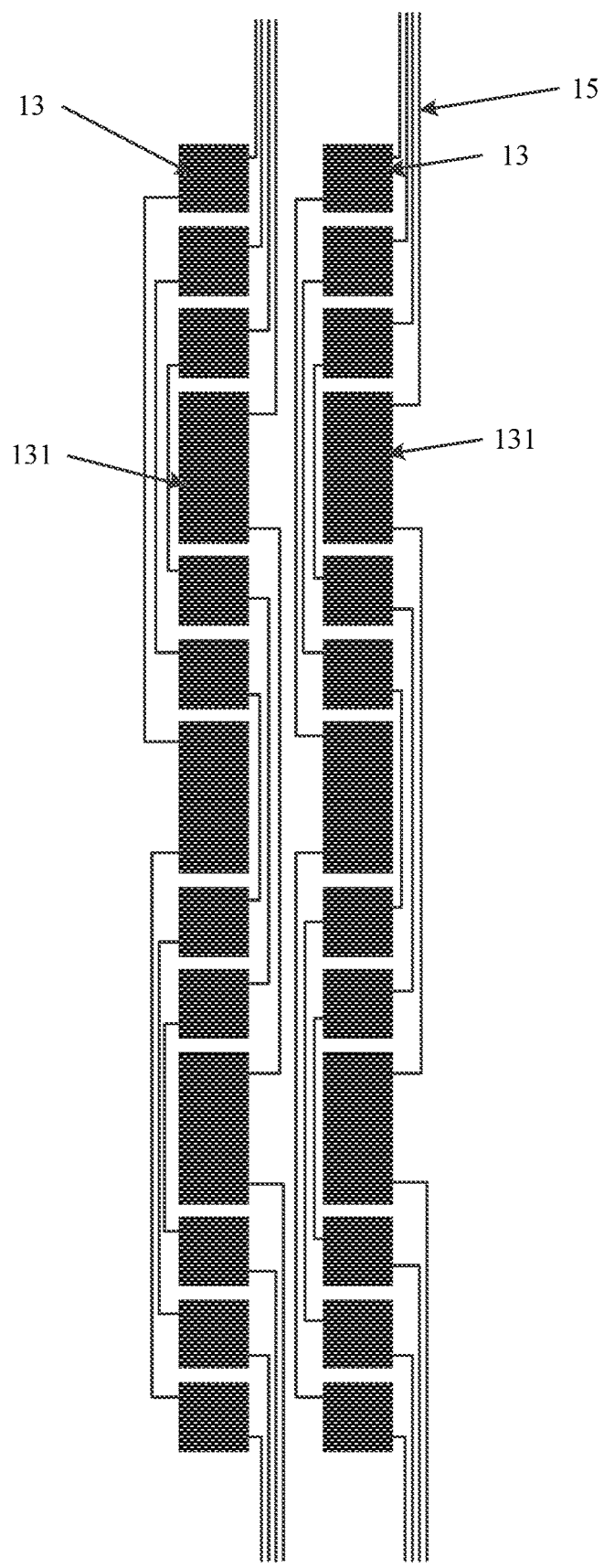
FIG. 8 is an example diagram of first electrodes according to a further embodiment of the present disclosure.
Figure 9:
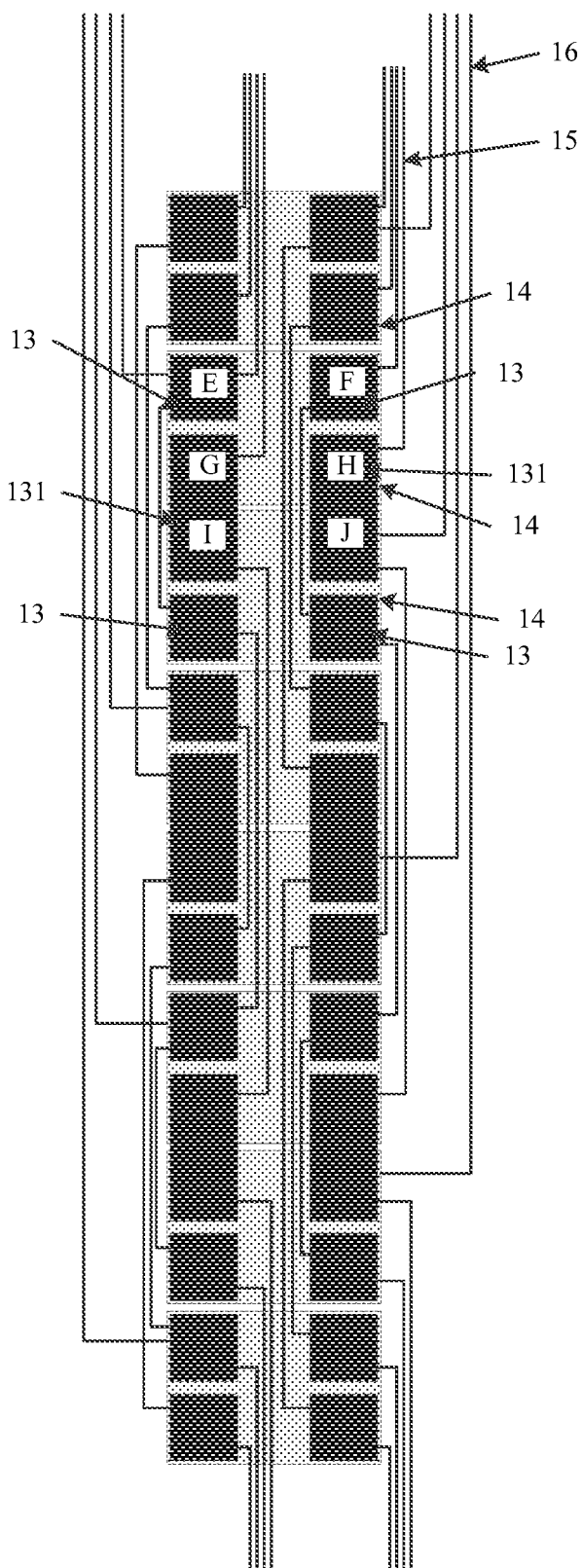
FIG. 9 is an example diagram of a positional relationship between first electrodes and second electrodes according to a further embodiment of the present disclosure.

FIG. 8 is an example diagram of first electrodes provided by a further embodiment of the present disclosure. FIG. 9 is an example diagram of a positional relationship between first electrodes and second electrodes according to a further embodiment of the present disclosure. This embodiment is a variation of the foregoing embodiment shown in FIG. 1. The main structure of the display panel of this embodiment is basically the same as that of the embodiment of FIG. 1, except that two first electrodes in the first electrode column which are adjacent to each other and electrically connected to each other form an integral electrode block. As shown in FIG. 8, four first leads among the plurality of first leads are configured to transmit the first driving signal to a column of first electrodes among the plurality of first electrodes in an array, the four first leads are electrically connected to first four first electrodes in this column of first electrodes, respectively, and the four first electrodes are closer to the four first leads than the remaining first electrodes in this column of first electrodes. The fourth first electrode and the fifth first electrode in the column of first electrodes form an integral electrode block. Similarly, the eighth first electrode and the ninth first electrode in the column of first electrodes form an integral electrode block, and the twelfth first electrode and the thirteenth first electrode form an integral electrode block.

As shown in FIG. 9, a second second electrode 14 cooperates with an upper portion of a first electrode block 131 in the first column to form a region of pixel G, this second electrode 14 cooperates with an upper portion of a first electrode block 131 in the second column to form a region of pixel H, a third second electrode 14 cooperates with a lower portion of the first electrode block 131 in the first column to form a region of pixel I, and the third second electrode 14 cooperates with a lower portion of the first electrode block 131 in the second column to form a region of pixel J.

As shown in FIG. 9, in case the second second electrode 14 receives an effective second driving signal, and the third first electrode 13 in the first column receives an effective first driving signal, a pixel E emits light. In case the second second electrode 14 receives an effective second driving signal, and the third first electrode 13 in the second column receives an effective first driving signal, a pixel F emits light. In case the second second electrode 14 receives an effective second driving signal, and the first first electrode block 131 in the first column receives an effective first driving signal, the pixel G emits light. In case the second second electrode 14 receives an effective second driving signal, and the first first electrode block 131 in the second column receives an effective first driving signal, the pixel H emits light. If the third second electrode 14 receives an effective second driving signal, and the first first electrode block 131 in the first column receives an effective first driving signal, the pixel I emits light. If the third second electrode 14 receives an effective second driving signal, and the first first electrode block 131 in the second column receives an effective first driving signal, the pixel J emits light. When the second second electrode 14 and the third second electrode 14 both receive an effective first driving signal, and the first electrode blocks 131 in the first column and the second column both receive an effective second driving signal, all the pixels G, H, I, J emit light.

Without affecting the driving to the pixels, in this embodiment, connection lines between adjacent first electrodes that need to be electrically connected are omitted, thereby simplifying the layout of electrical signal lines of the display panel.

The arrangement of first electrodes provided by the embodiment shown in FIG. 8 or FIG. 9 may be combined with any of the foregoing embodiments to simplify the layout of electrical signal lines of the display panel.

Based on the technical concept of the foregoing embodiments, an embodiment of the present disclosure provides a method for manufacturing a display panel according to any of the foregoing embodiments.

The manufacturing method provided by this embodiment comprises: preparing a first substrate, the first substrate comprising a first base and a plurality of first electrodes in an array on the first base; preparing a second substrate, the second substrate comprising a second base and a plurality of second electrodes in an array on the second base; forming a liquid crystal layer between the first substrate and the second substrate, the orthographic projection of each second electrode on the first base at least partially overlap the orthographic projections of n first electrodes on the first base, n being an integer greater than 1.

According to a further embodiment of the disclosure, preparing a first substrate comprises: fabricating a plurality of first leads on the first base, the plurality of first leads are configured to transmit a first driving signal to the plurality of first electrodes, at least two first electrodes in each column of first electrodes among the plurality of first electrodes in an array are electrically connected to the same first lead to receive the same first driving signal.

A further embodiment of the disclosure further provides a display device comprising the display panel described in any one of the foregoing embodiments. The display device may be any product or component having a display function, such as a mobile phone, a tablet computer, a television, a display, a notebook computer, a digital photo frame, a navigator, and the like.

In the description of the embodiments of the disclosure, it is to be understood that the orientations or positional relationships indicated by the terms "row", "column", "middle", "upper", "lower", "front", "rear", "vertical", "horizontal", "top", "bottom", "inner", "outer", etc. are based on the orientations or positional relationships illustrated in the drawings, which are only for the convenience of describing the present disclosure and simplifying the description, rather than indicating or implying that a device or element referred to must have a specific orientation, and be constructed and operate in a specific orientation, and therefore should not be construed as limiting the present disclosure.

In the description of the embodiments of the present disclosure, it is to be noted that the terms "install", "link" and "connect" should be understood in a broad sense unless otherwise specified and limited. For example, it may be a fixed connection, a detachable connection, or an integral connection; it may be a mechanical connection or an electrical connection; it may be a direct connection, an indirect connection through an intermediate element, or a communication between two elements. For a person having an ordinary skill in the art, the specific meanings of the above terms in the present disclosure may be understood on a case-by-case basis.

The contents described above based on the embodiments of the present disclosure are only intended to facilitate understanding of the present disclosure, rather than limit the scope of the present patent application. Any person skilled in the art to which the present disclosure pertains may make any modification and change in the form and details of implementation without departing from the spirit and scope revealed by the disclosure, but the scope of patent protection for this patent application is still based on the scope defined by the appended claims.

The invention claimed is:

1. A display panel comprising:
   a first substrate and a second substrate opposite to each other,
   wherein the first substrate comprises a first base, the second substrate comprises a second base, the first substrate further comprises a plurality of first electrodes in an array on the first base, and the second substrate further comprises a plurality of second electrodes in an array on the second base, and
   wherein an orthographic projection of each second electrode of the plurality of second electrodes on the first base at least partially overlaps orthographic projections of n first electrodes of the plurality of first electrodes on the first base,
   wherein n is an integer greater than 1,
   wherein the first substrate further comprises a plurality of first leads outside a region of the plurality of first electrodes,
   wherein the plurality of first leads are configured to transmit a first driving signal to the plurality of first electrodes,
   wherein the second substrate further comprises a plurality of second leads outside a region of the plurality of second electrodes, and
   wherein the plurality of second leads are configured to transmit a second driving signal to the plurality of second electrodes,
   wherein h first leads among the plurality of first leads are configured to transmit the first driving signal to a column of first electrodes among the plurality of first electrodes, the h first leads are electrically connected to first h first electrodes in the column of first electrodes, respectively, and the h first electrodes are closer to the h first leads than remaining first electrodes in the column of first electrodes,
   wherein an i-th first electrode among the h first electrodes is electrically connected to a (2h−(i−1))-th first electrode and a (2h+i)-th first electrode in the column of first electrodes,
   wherein h is an integer greater than or equal to 1, and i is an integer greater than or equal to 1 and less than or equal to h.

2. The display panel according to claim 1, wherein two first electrodes adjacent to each other and electrically connected to each other in the column of first electrodes among the plurality of first electrodes form an integral electrode block.

3. A display panel comprising:
   a first substrate and a second substrate opposite to each other,
   wherein the first substrate comprises a first base, the second substrate comprises a second base, the first substrate further comprises a plurality of first electrodes in an array on the first base, and the second substrate further comprises a plurality of second electrodes in an array on the second base, and
   wherein an orthographic projection of each second electrode of the plurality of second electrodes on the first base at least partially overlaps orthographic projections of n first electrodes of the plurality of first electrodes on the first base,
   wherein n is an integer greater than 1,
   wherein the first substrate further comprises a plurality of first leads outside a region of the plurality of first electrodes,
   wherein the plurality of first leads are configured to transmit a first driving signal to the plurality of first electrodes,
   wherein the second substrate further comprises a plurality of second leads outside a region of the plurality of second electrodes, and
   wherein the plurality of second leads are configured to transmit a second driving signal to the plurality of second electrodes,
   wherein at least two first electrodes in each column of first electrodes among the plurality of first electrodes are electrically connected to a same first lead to receive a same first driving signal,
   wherein the plurality of first leads comprises m sets of first leads,
   wherein each set of first leads are electrically connected to two adjacent columns of first electrodes among the plurality of first electrodes, respectively,
   wherein orthographic projections of a column of second electrodes among the plurality of second electrodes on the first base overlap orthographic projections of two adjacent columns of first electrodes not electrically connected to a same set of first leads on the first base, and
   wherein m is an integer greater than 1.

4. The display panel according to claim 1, wherein the display panel further comprises a liquid crystal layer between the first substrate and the second substrate.

5. The display panel according to claim 1,
   wherein the display panel further comprises an organic electroluminescent layer, and
   wherein the organic electroluminescent layer is between the plurality of first electrodes and the plurality of second electrodes.

6. The display panel according to claim 1, wherein the orthographic projection of each second electrode of the plurality of second electrodes on the first base overlaps the orthographic projections of the n first electrodes on the first base.

7. A display device comprising the display panel according to claim 1.

8. The display panel according to claim 6, wherein the display panel further comprises a liquid crystal layer between the first substrate and the second substrate.

9. The display panel according to claim 6,
   wherein the display panel further comprises an organic electroluminescent layer, and
   wherein the organic electroluminescent layer is between the plurality of first electrodes and the plurality of second electrodes.

10. A display device comprising the display panel according to claim 3.

11. The display device according to claim 10, wherein the display panel further comprises a liquid crystal layer between the first substrate and the second substrate.

12. The display device according to claim 10,
wherein the display panel further comprises an organic electroluminescent layer, and
wherein the organic electroluminescent layer is between the plurality of first electrodes and the plurality of second electrodes.

13. The display panel according to claim 3, wherein the display panel further comprises a liquid crystal layer between the first substrate and the second substrate.

14. The display panel according to claim 3,
wherein the display panel further comprises an organic electroluminescent layer, and
wherein the organic electroluminescent layer is between the plurality of first electrodes and the plurality of second electrodes.

* * * * *